United States Patent
Ishikawa et al.

(10) Patent No.: US 7,791,383 B2
(45) Date of Patent: Sep. 7, 2010

(54) SEMICONDUCTOR DEVICE HAVING INPUT CIRCUITS ACTIVATED BY CLOCKS HAVING DIFFERENT PHASES

(75) Inventors: Toru Ishikawa, Tokyo (JP); Kunihiko Katou, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/213,817

(22) Filed: Jun. 25, 2008

(65) Prior Publication Data

US 2008/0265956 A1 Oct. 30, 2008

Related U.S. Application Data

(63) Continuation of application No. 11/296,287, filed on Dec. 8, 2005, now Pat. No. 7,400,180.

(30) Foreign Application Priority Data

Dec. 9, 2004 (JP) .............................. 2004-357118
Nov. 18, 2005 (JP) .............................. 2005-334648

(51) Int. Cl.
*H03L 7/00* (2006.01)
(52) U.S. Cl. ...................... 327/144; 375/355; 327/99
(58) Field of Classification Search ................. 327/141, 327/144; 375/355
See application file for complete search history.

(56) References Cited

U.S. PATENT DOCUMENTS

| 4,756,011 A | 7/1988 | Cordell |
| 5,886,552 A | 3/1999 | Chai et al. |
| 6,127,864 A * | 10/2000 | Mavis et al. ................. 327/144 |
| 6,266,799 B1 | 7/2001 | Lee et al. |
| 6,556,640 B1 | 4/2003 | Baba |
| 6,826,390 B1 | 11/2004 | Tamura |
| 7,221,723 B2 | 5/2007 | Walker |
| 2003/0123591 A1 | 7/2003 | Walker |
| 2005/0033902 A1 | 2/2005 | Tamura |

FOREIGN PATENT DOCUMENTS

| EP | 1 365 530 B1 | 4/2007 |
| JP | 62-154665 | 7/1987 |
| JP | 05-252017 | 9/1993 |
| JP | 05-335493 | 12/1993 |
| JP | 06-111033 | 4/1994 |
| JP | 07-326713 | 12/1995 |
| JP | 08-088557 | 4/1996 |
| JP | 2001-027919 A | 1/2001 |
| JP | 2003-347925 A | 12/2003 |

* cited by examiner

*Primary Examiner*—Lincoln Donovan
*Assistant Examiner*—Ryan C Jager
(74) *Attorney, Agent, or Firm*—Foley & Lardner LLP

(57) ABSTRACT

Input circuits connected to an external input terminal PAD via resistor elements are activated in response to the level transition of the clock signals supplied thereto for accepting input signals. In order to input signals applied to the external input terminal PAD clock signals having different phases are supplied to the respective input circuits. The cycle time of each one input circuit can be made longer by sequentially assigning the serial data supplied to the external input terminals in response to the clock signals having different clock signals. Since the input circuits are isolated from each other by means of the resistor elements, the influence of the kick back signal which occurs at first stage of each the input circuit upon the other input circuit can be made very small.

13 Claims, 12 Drawing Sheets

SEMICONDUCTOR DEVICE HAVING INPUT CIRCUITS ACTIVATED BY CLOCKS HAVING DIFFERENT PHASES

CROSS-REFERENCE TO RELATED PATENT APPLICATIONS

This application is a continuation of application Ser. No. 11/296,287, filed Dec. 8, 2005, now pending, and based on Japanese Patent Application No. 2004-357118, filed Dec. 9, 2004, and Japanese Patent Application No. 2005-334648, filed Nov. 18, 2005, by Toru Ishikawa and Kunihiko Katou, the disclosures of which are incorporated herein by reference in their entirety. This application claims only subject matter disclosed in the parent application and therefore presents no new matter.

FIELD OF THE INVENTION

The present invention relates to a semiconductor device and in particular to a semiconductor device comprising a plurality of input circuits connected to an external input terminal.

BACKGROUND OF THE INVENTION

Recently, the time interval between data signals input to fast response semiconductor devices has become shorter. A number of semiconductor devices include a plurality of input circuits which accept two or four data via an external input terminal in response to one clock signal. Such a semiconductor device may include memories having a fast data transfer capability such as Double Data Rate Synchronous DRAM (DDRSDRAM) and Quad Data Rate (QDR) SRAM, the time interval between data which are input to input circuits for such a semiconductor device is for example 312.5 ps when the device is operated at a frequency of for example, 3.2 Ghz, so that a kick back which is caused when an input circuit senses data at an edge of a clock signal may give an adverse influence upon data sense at next clock edge.

An effect of kick back in the input circuits will now be described. FIG. 7 is a circuit diagram showing an exemplary configuration of a first stage circuit of a typical input circuit (hereinafter simply referred to as "input circuit") which is used in fast memories and the like. A transistor Q100 (generally referred to as BVDS transistor) which is an electrostatic discharge protecting element is directly connected to a pad PAD to which data signals are input. The pad PAD is connected to a transistor Q101 which is an electrostatic protecting element via a resistor element R100 and then connected to the gate of transistor Q102 at the first stage of the input circuit 100. The size of the transistor Q100 is 50 times of that of the transistor Q101, so that its electrostatic discharge protecting capability is enhanced. The size of the transistor Q101 is approximately equal to that of the transistors used in the input circuit 100. A large bipolar diode may be connected in lieu of the transistor Q100. An example of such an input protective circuit is disclosed in, for example, Patent Document No. 1 and the like.

In FIG. 7, transistors Q102 and Q103 constitute a differential amplifier of the first stage of the input circuit 100, which is operative when the clock CK becomes the high level. Output signals OUT1 and OUT2 which are in an opposite phase are output via flip-flops which are formed of transistors Q109 and Q110, Q111 and Q112, which are loads of the differential amplifier depending upon whether the potential at the gate of the transistor Q102 is higher or lower than that of a reference signal applied to the gate of transistor Q103. On the other hand, when the clock CK is in the low level, transistor Q104 is turned off, so that transistors Q102 and Q103 are not operative, while transistors Q107 and Q108 are turned on, so that output signals OUT1, OUT2 are in the high level.

Since the clock CK is in the low level, transistor Q104 is turned off, all of the inner contacts of the input circuit are precharged to a voltage of about VDD. When clock CK becomes high level, differential amplification begins, so that a result is ultimately latched at the flip-flop which constitutes load. As a result, all of the sources and drains of the transistors of the differential amplifier become GND level and an opposing electrode of the gate of transistor Q102 becomes GND potential so that the potential at the gate is slightly lowered due to charge of the gate capacitance. Conversely, when the opposing electrode is reset and in the precharged state, it is charged to about the level of VDD and the charge on the gate is discharged to elevate the potential at the gate.

When the first input stage of the input circuit 100 is controlled by clock CK as mentioned above, the potential at the stage of transistor Q102 will change whenever the level of the clock CK changes. This phenomenon is called "kick back". If an other circuit is connected to the gate of transistor Q102, this kick back will give an influence upon the other circuit.

A semiconductor device in which a time lag due to the presence of an input protective resistor and the gate capacity of a transistor at a first stage is made shorter to make response speed faster is disclosed in Patent Document 2. This semiconductor device is configured so that one external input signal path is divided into plural parts, each of is provided with an which input protective circuit.

A semiconductor integrated circuit in which its input circuit of MOS integrated circuit is operated at a high speed without decreasing the resistance of the input protective resistor is disclosed in Patent Document No. 3. In this semiconductor integrated circuit, a plurality of input portions each comprising an input protective circuit and input circuit are connected in a parallel manner between an input terminal and inner logical circuits. This makes it possible to make the period for which the output voltage of the input circuit changes shorter by increasing the driving power of the input circuit even if the minimum value of the resistance of the input protective resistor is determined.

[Patent Document 1] Japanese Patent Kokai Publication No. JP-A-5-335493

[Patent Document 2] Japanese Patent Kokai Publication No. JP-A-62-154665

[Patent Document 3] Japanese Patent Kokai Publication No. JP-A-7-326713

SUMMARY OF THE INVENTION

When data are serially received at high speed and are processed in a circuit in a parallel manner, provision of a plurality of input circuits and consecutively assigning of serial data to the input circuits enables the cycle time of one input circuit to be longer, a stable operation is made possible. FIG. 8 is a block diagram showing the configuration of a semiconductor device in which a plurality of input circuits are connected to one external input terminal. One protective resistor R100 is commonly used for four input circuits 100a through 100d. Input circuits shown in FIG. 7 are used as the input circuits 100a through 100d. Data signal which is input from the pad PAD is a small amplitude signal. A difference between the data signal and a reference signal is amplified by using the rise-up edges of clock signals CK 100 through CK 103 as a trigger. Since a node A in FIG. 7 is operative at an amplitude depending upon the power supply voltage at this time, the node A will give an influence upon the gate side of transistor Q102 via a gate overlap capacitance. This influence is applied to the gate of transistor Q102 of the other circuits, so that input signal to other input circuits will change. This influence is about 10 ps which is not so longer compared with the set-up and hold time of the input signal. However, recent fast response devices have a standard value of about 100 ps of set-up and hold time, so that influence of the above mentioned kick back can not be ignored. As a result, there is a likelihood that the semiconductor devices will not be necessarily operated in a stable manner.

On the other hand, the semiconductor device as disclosed in Patent Document No. 2, one external input signal path is divided into a plurality of paths, each provided with an input protective circuit to achieve a fast responding speed. However, any influence of kick back which may occur when circuits having the same configurations are consecutively operated is not considered.

The semiconductor integrated circuit disclosed in Patent Document No. 3 comprises n input circuits, one input terminal and n input protective resistors each connected between an input terminal of each input circuit and said one input terminal for protecting each input circuit. Similarly to the device of Patent Document 2, any influence of kick back which may occur when circuits having identical configurations are consecutively operated is not considered.

Thus there is much to be desired in the art.

According to one aspect of the present invention, there is provided a semiconductor device comprising: an external input terminal; a plurality of resistor elements which are connected to the external input terminal; and a plurality of input circuits each connected to the external input terminal through any one of the resistor elements. The input circuits are activated in response to the level transition of supplied clock signals for accepting input signals; the clock signals having different phases being supplied to the respective input circuits for accepting signals supplied to the external input terminal.

According to another aspect of the present invention, there is provided a semiconductor device comprising: an external input terminal; a first through N-th resistor elements (N is a natural number more than one) each having one end connected to the external input terminal; and first through (N×M)-th input circuits (M is a natural number which is one or more); wherein the K-th, (K+N)-th, ... (K+N(M−1))-th of the input circuits have a common input terminal; are connected to another terminal of the K-th resistor element; and are activated in response to the level transition of clock signals supplied thereto for accepting input signals applied to the external input terminal; provided that a clock signal which is out-of-phase from a clock signal supplied to the (N×M)-th input terminal by a period of time L×T/(N×M) is supplied to the L-th input circuit where T is the period of the clock signal, and L is an integer of 1 through N×M−1.

The meritorious effects of the present invention are summarized as follows.

Since the input terminals of the input circuits are isolated from each other by resistor elements in accordance with the present invention, the influence of a kick back signal which occurs in each input circuit, upon the other input circuits is remarkably reduced. Therefore, the semiconductor device comprising a plurality of consecutively operating input circuits which are connected to one external input terminal is stably operated at a high speed.

DETAILED DESCRIPTION OF THE PREFERRED EMBODIMENTS

Figure 1:
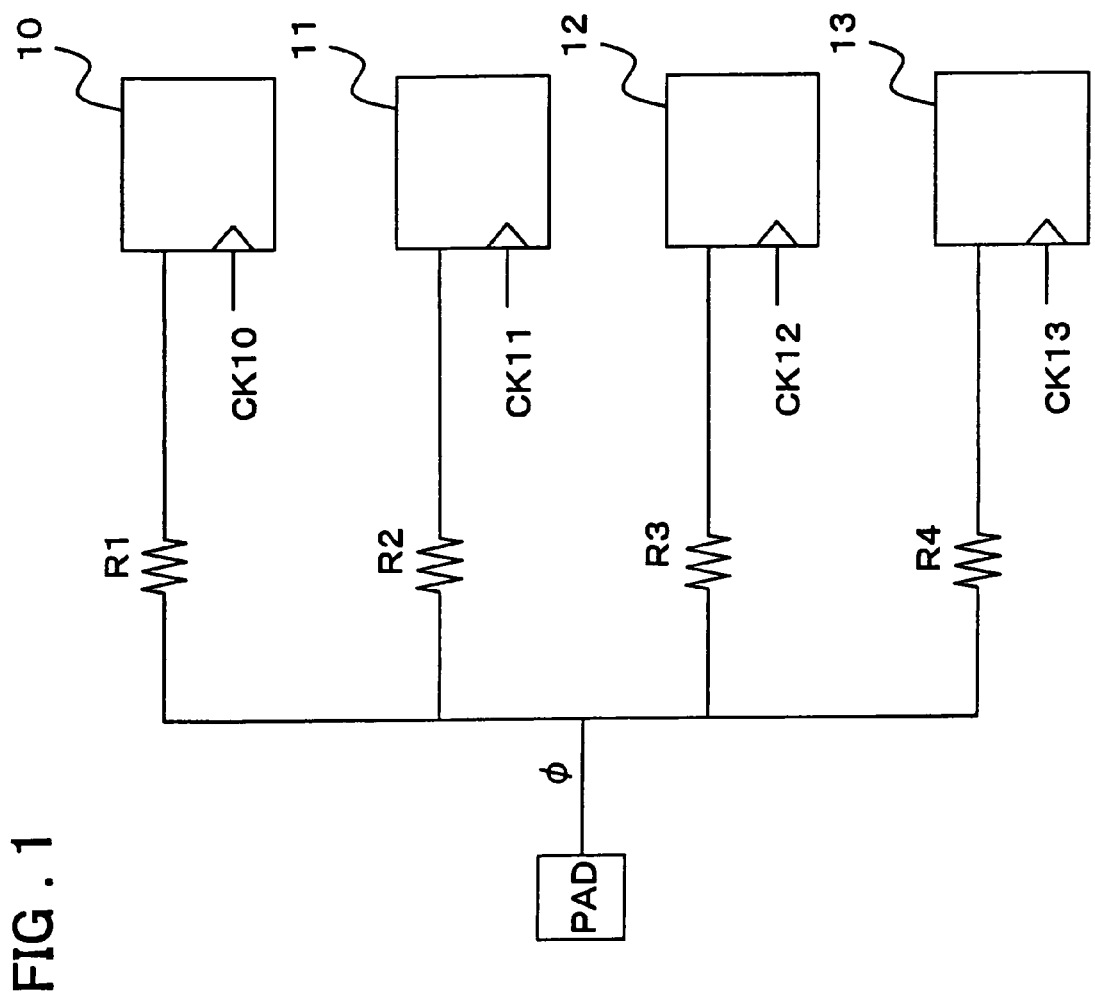
FIG. 1 is a block diagram showing the configuration of a semiconductor device of a first embodiment of the present invention.

A semiconductor device of one embodiment of the present invention comprises an external input terminal (PAD in FIG. 1), N (N=4 in FIG. 1) resistor elements (R1, R2, R3, R4 in FIG. 1) which are connected to the external input terminal, and N input circuits (10, 11, 12, 13 in FIG. 1) each connected to the external input terminal via each of the resistor elements. The input circuits are activated in response to the level transition of supplied clock signal for accepting input signals. In order to serially input signals supplied to the external input terminal, clock signals (CK 10, CK 11, CK 12, CK 13 in FIG. 1) having different phases are supplied to respective input circuits. In other words, if the clock signal has a cycle period of T, clock signals which are out-of-phase by T/N from each other are supplied.

Thus formed semiconductor device serially assigns the serial data supplied to the external input terminal to the input terminals in response to the clock signals having different phases to make the cycle time of each one input circuit longer. Since the input circuits are isolated from each other by the resistor elements at this time, the influence of a kick back signal which occurs in the first stage of each input circuit, upon the first stage of the other input circuit can be made very small. Therefore, the plurality of input circuits which are connected to one external input terminal are stable when they are operated at a high speed. Now, the present invention will be described in detail with reference to embodiments shown in the drawings.

Embodiment 1

FIG. 1 is a block diagram showing the configuration of a semiconductor device of a first embodiment of the present invention.

Figure 7:
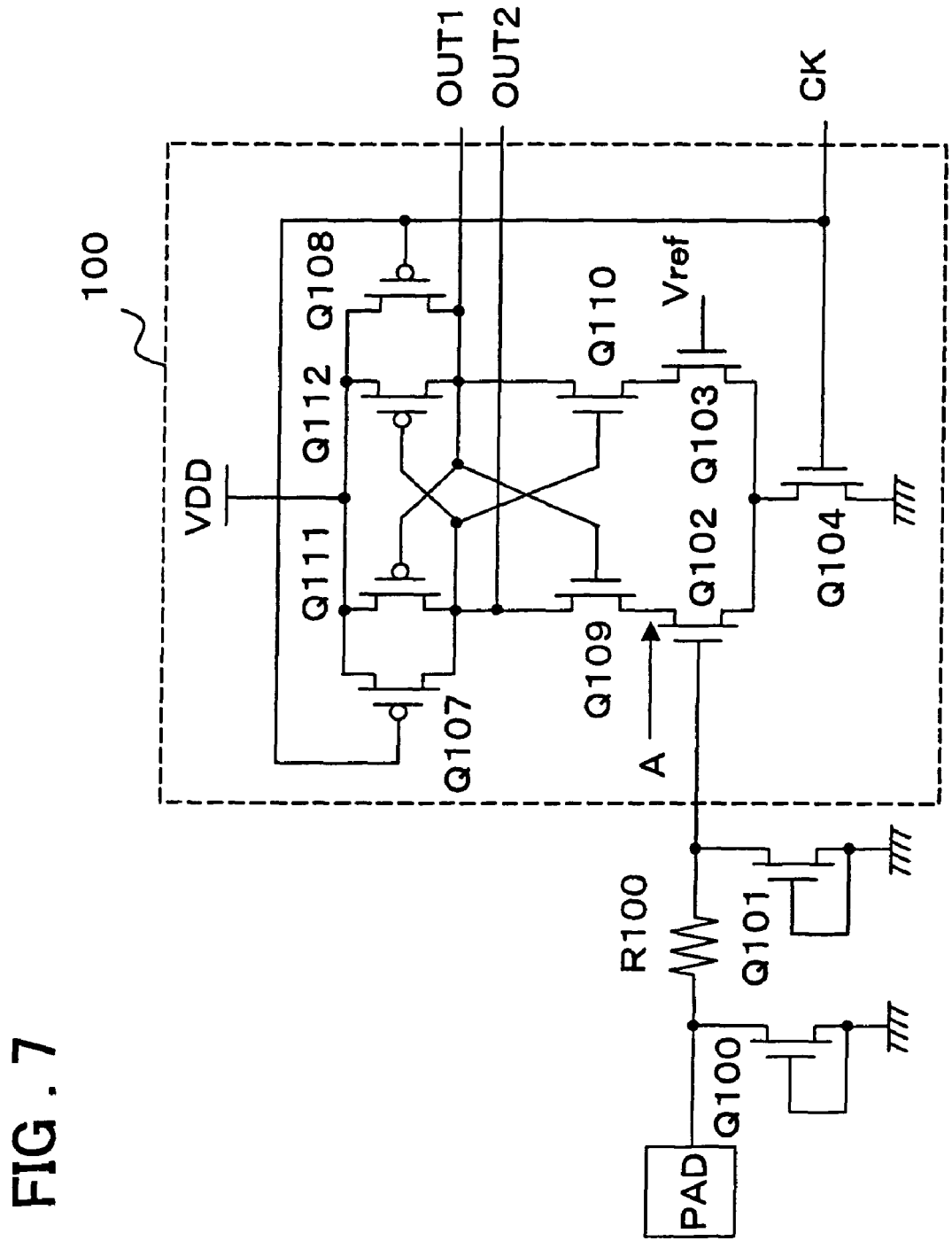
FIG. 7 is a circuit diagram showing an exemplary configuration of an input circuit.

In FIG. 1, the semiconductor device comprises a pad PAD which is an external input terminal; resistor elements R1, R2, R3, R4; and input circuits 10, 11, 12,13. Each of the input circuits 10, 11, 12, 13 comprises an input circuit 100 shown in, for example FIG. 7, which has been mentioned. The input circuits are connected to the pad PAD through the respective resistor elements R1, R2, R3, R4. In order to accept (allow to enter) input data supplied to the pad PAD, clock signals CK 10, CK 11, CK 12, CK 13 are supplied to the input circuits 10, 11, 12, 13, respectively. The input circuits 10, 11, 12, 13 are activated in response to the level transition of the clock signals CK 10, CK 11, CK 12, CK 13 supplied thereto for amplifying a signal applied to the pad PAD. The clock signals CK10, CK11, CK12, CK13 are out-of-phase by ¼ period from one another. The input circuits 10, 11, 12, 13 accept input data having a time lag. The resistor elements R1, R2, R3, R4 serve to protect the device against electrostatic discharge (ESD) occurring in the pad PAD for preventing the first stage of input circuits 10, 11, 12, 13 from being damaged due to ESD. Although explicitly shown in FIG. 1, transistors Q100, Q101 which are electrostatic discharge protective elements as shown in FIG. 7 may be connected.

Figure 2:
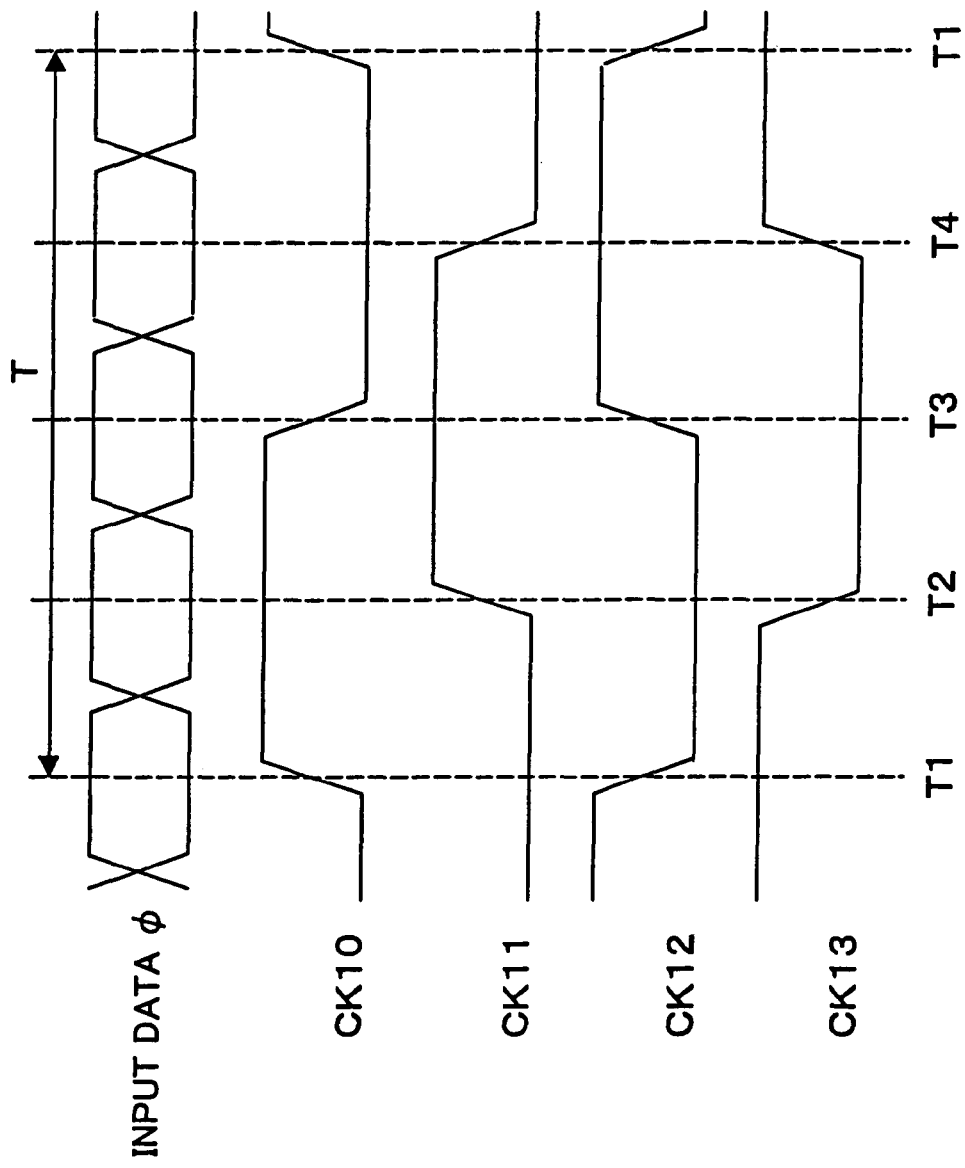
FIG. 2 is a timing chart of data inputs in the semiconductor device of the present invention.

Now, the timing for accepting the input data in the thus formed semiconductor device will be described. FIG. 2 is a timing chart of data input in the semiconductor device of the first embodiment of the present invention. The input data which is applied to the pad PAD is such that four data are switched for one period of T of the clock signal. First data is amplified by the input circuit 10 when it is triggered by the rise-up of the clock CK10 (at time T1) to be activated. Similarly, second data is amplified by the input circuit 11 when it is triggered by the rise-up of the clock CK11 (at time T2) to be activated. Third data is amplified by the input circuit 12 when it is triggered by the rise-up of the clock CK12 (at time T3) to be activated. Fourth data is amplified by the input circuit 13 when it is triggered by the rise-up of the clock CK13 (at time T4) to be activated.

Since the input circuits 10, 11, 12, 13 are connected to the pad PAD through any of resistor elements R1, R2, R3, R4, respectively in the thus formed semiconductor, the kick back occurring at the input terminal of each input circuit may reach input terminals of the other input circuits via resistor elements. For example, the kick back in the input circuit will reach the input terminal of the input circuit 11 through the resistor elements R1, R2. Since the signal component caused by the kick back may be attenuated and reach the other input terminal in this case, the influence of the kick back upon the other input circuit is made very small. This eliminates the influence of the kick back when input data φ is accepted to the input circuit, so that each input circuit is capable of stably accepting input data φ.

Embodiment 2

Figure 3:
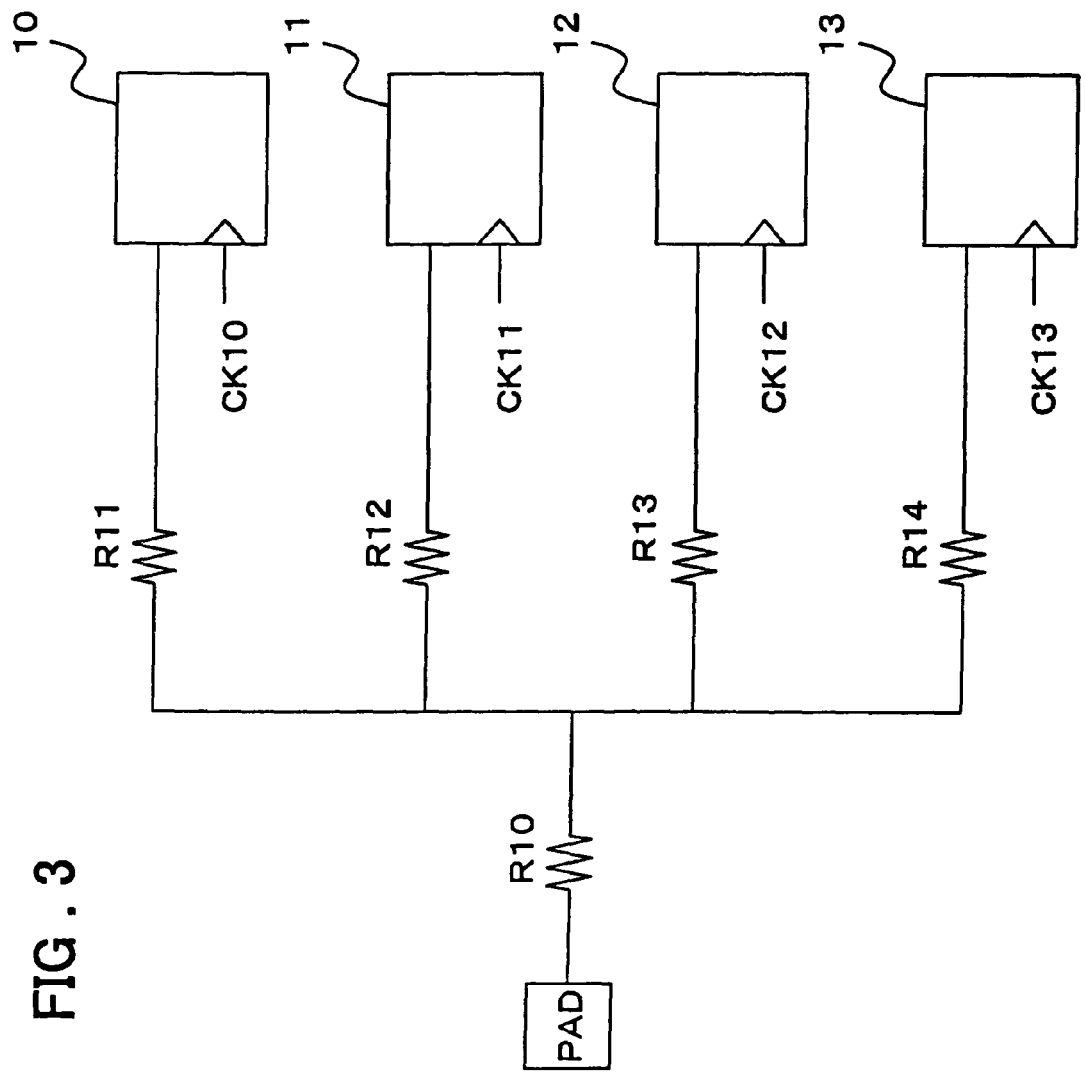
FIG. 3 is a block diagram showing the configuration of a semiconductor device of a second embodiment of the present invention.

FIG. 3 is a block diagram showing the configuration of a semiconductor device of a second embodiment of the present invention. The semiconductor device comprises a pad PAD which is an external input terminal; resistor elements R10, R11, R12, R13, R14; and input circuits 10, 11, 12, 13. The input circuit s10, 11, 12, 13 are connected one end of the resistor element RIO via the resistor elements R11, R12, R13, R14, respectively. The other end of the resistor element R10 is connected to the pad PAD. Since the input circuits 10, 11, 12, 13 are similar to those of embodiments and similarly function, description thereof will be omitted herein.

The resistor element R10 is a protective resistor which prevents the device from electrostatic damage. The resistor elements R11, R12, R13 and R14 are usual resistor elements. The resistor element R10 having a large layout area in the design standards of the semiconductor device is shared in the device of FIG. 3 and is configured to isolate input circuits at a usual resistance. The protective resistor is only the resistor element R10. The resistor elements R11, R12, R13 and R14 are usual resistor elements and need not satisfy the design standard of the protective resistor. The protective resistor requires a large area in view of layout since it has a predetermined design standard for preventing the electrostatic damages to the device and requires a wide width unlike the other resistor elements in the device. Since the protective resistor per se shared by input circuits and input ends of the input circuits are isolated by the usual standard resistor wiring in the semiconductor device of embodiment 2, the layout area can be made less than that of the embodiment 1 in which four protective resistors are provided.

A method of selecting the resistances of the resistor elements R11, R12, R13 and R14 will now be described. The input circuit 11 which is most influenced by the kick back occurring in the input circuit 10 will be considered. In other words, data acceptance into the input circuit 11 responsive to the clock CK11 which is most close to the rise-up of the clock CK10 at input circuit is most influenced by the rise-up of the clock CK10. Therefore, it suffices to describe only the configuration including the input circuits 10, 11 and the resistor elements R10, R11, R12 in FIG. 3.

Figure 8:
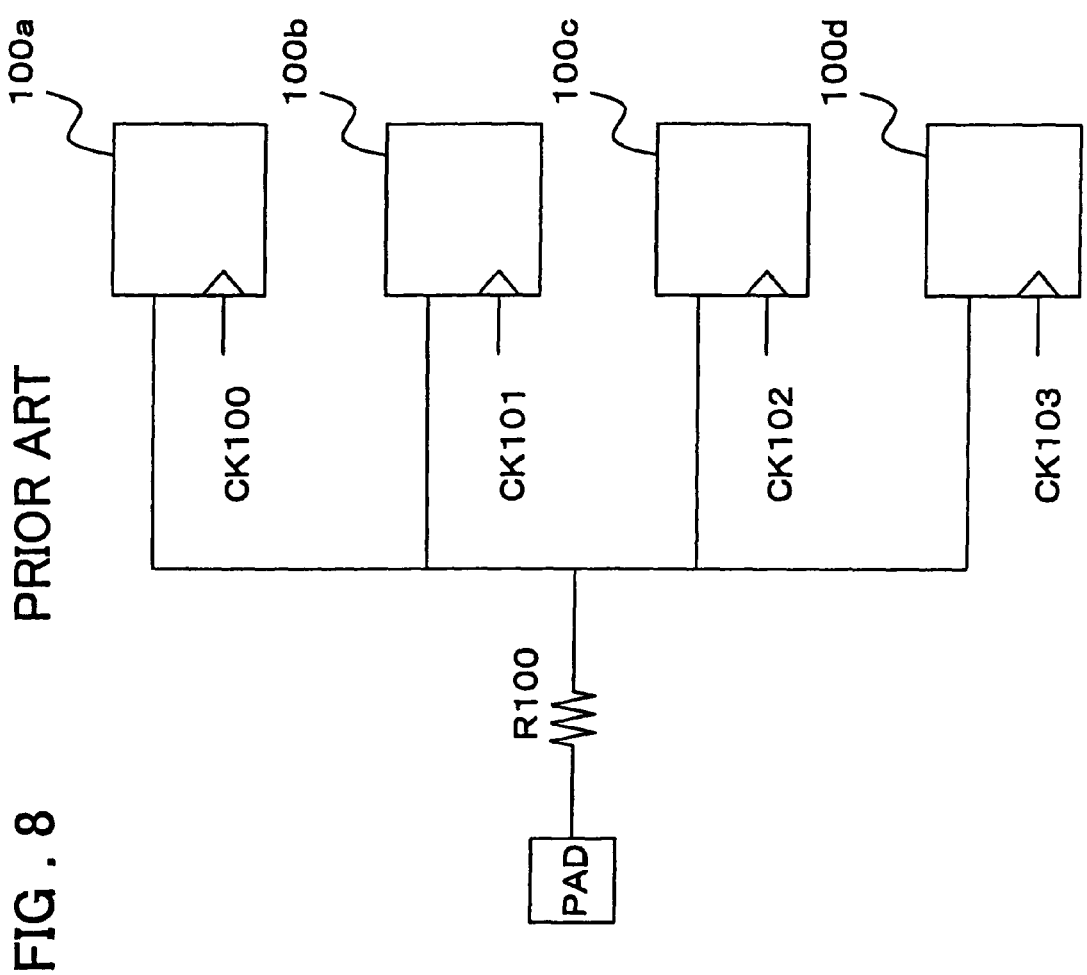
FIG. 8 is a block diagram showing the configuration of a semiconductor device in which a plurality of input circuits are connected to one external input terminal in the prior art.
Figure 9:
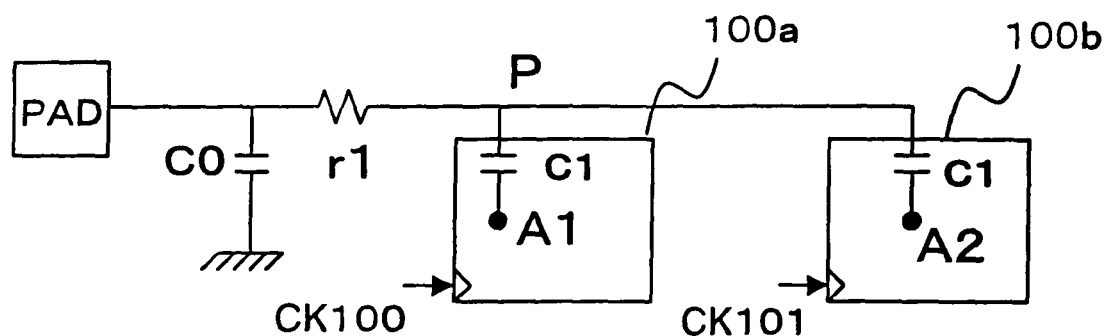
FIG. 9 is an equivalent circuit in the input stage of the prior art semiconductor device.

FIG. 9 is a circuit diagram showing an equivalent circuit in an input stage of a prior art semiconductor device shown in FIG. 8. Contacts A1, A2 in FIG. 7 correspond to a node A in FIG. 7. The contact A1 in the input circuit 100a corresponds to a kick back source. When a kick back occurs, it can be considered that the input circuit 100b is inactive and the contact A2 in the input circuit 110b is grounded. C1 denotes a coupling capacitance corresponding to the gate overlap capacitance between the node A in FIG. 7 and the gate of transistor Q102. Node P corresponds to a data input terminal in the input circuits 100a, 100b. r1 denotes a resistance of the resistor element R100, C0 denotes a capacitance such as capacitance of the protective element, PAD capacitance and gate capacitance on the output side etc. C0 is a value not less than 10 times of that of C1. Since PAD is usually driven at a low resistance, the impedance of the node on the input side can be considered as 0 (grounded).

Figure 10:
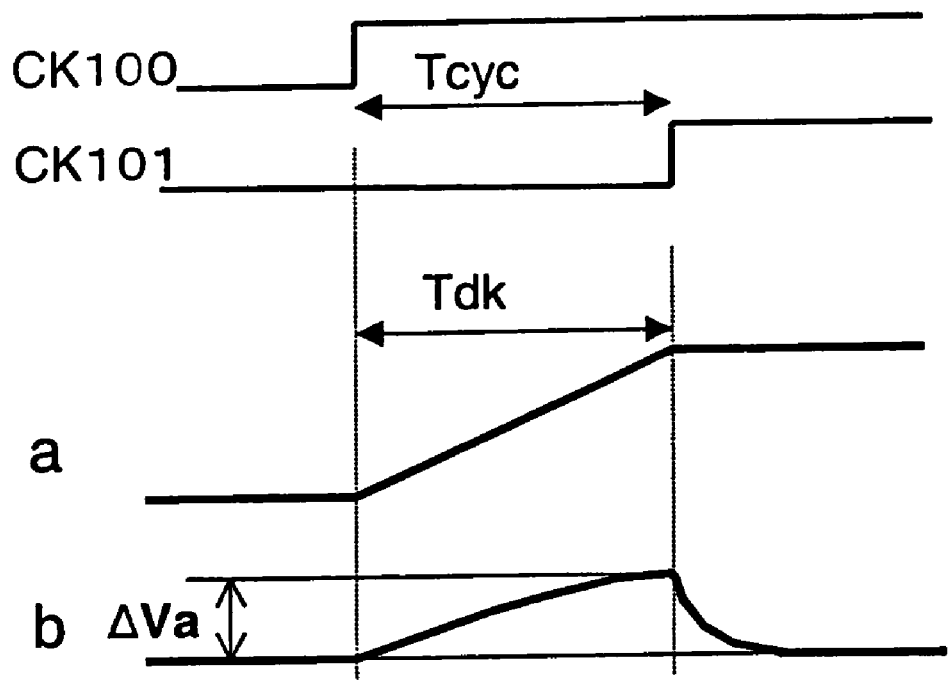
FIG. 10 is a diagram showing wave-forms at portions in the first stage of prior art semiconductor device.

FIG. 10 is a diagram showing wave-forms in various portions in FIG. 9. A kick back signal having a wave-form as shown at a, which is applied to a contact A1 is grounded via coupling capacitance C1 and resistance r1. The node P is grounded via coupling capacitance C1. At this time, the kick back signal which has been applied to the contact A1 is attenuated and appears at the node P while it has a wave-form as shown a wave-form b in FIG. 10. The peak value of this wave-form is represented as ΔVa. If the position of the peak coincides with the data accepting timing of clock CK101 at the input circuit 100b, that is, the rise-up time of the kick back Tdk coincides with the time interval between the clocks CK100 and CK101, the input circuit 100b is most influenced by the kick back.

Figure 11:
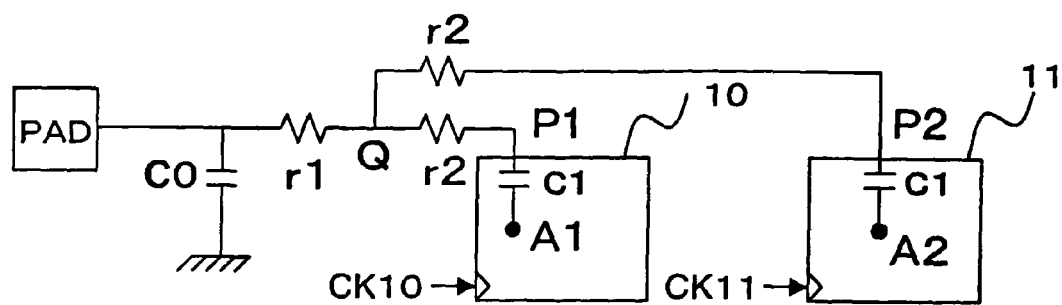
FIG. 11 is an equivalent circuit in the input stage of the semiconductor device of the second embodiment of the present invention.

FIG. 11 shows an equivalent circuit of the input stage of the semiconductor device shown in FIG. 3. Resistances r2 corresponding to the resistor elements R11, R12 are inserted between node P1 and P2 which are the data input terminals of the input circuit 10 and a node Q which is one end of the resistance r1 as compared to the equivalent circuit shown in FIG. 9. Since only C1, as capacitance, is connected to the node P1, the peak value is elevated by 2×ΔVa due to the influence of the kick back. In contrast, since the voltage level at the node Q is divided by resistances, the peak value is lowered by r1/(r1+r2) if r2 is sufficiently larger than r1.

Figure 12:
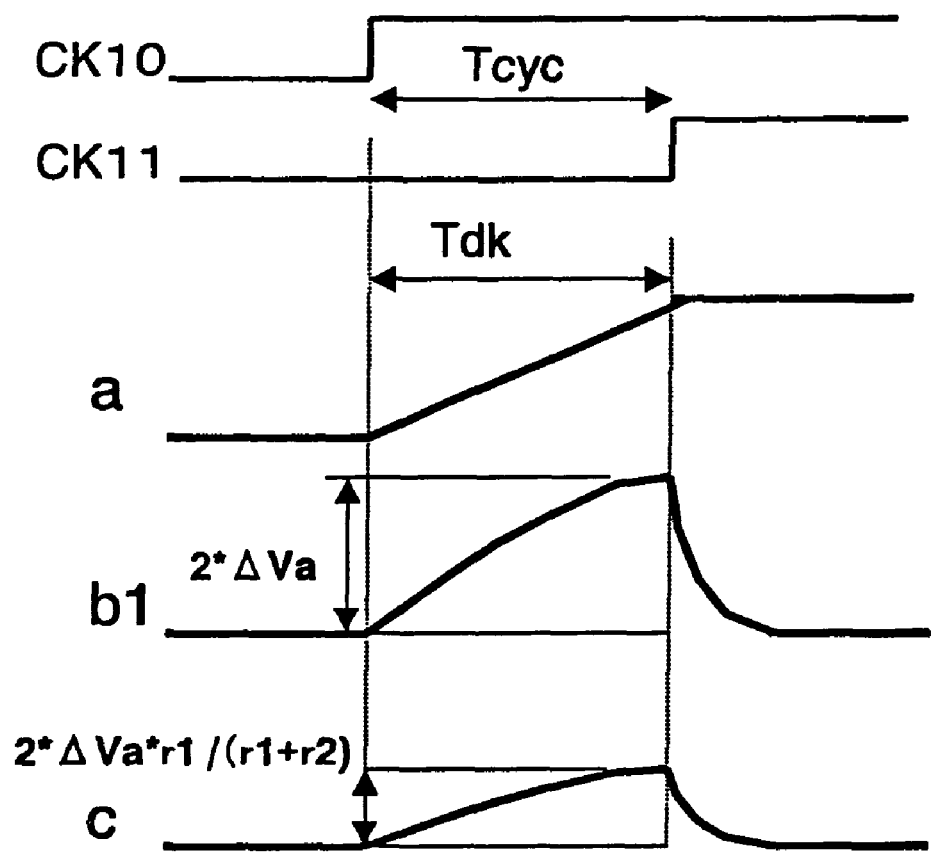
FIG. 12 is a diagram showing wave-forms at portions in the input stage of the semiconductor device of the second embodiment of the present invention.

FIG. 12 is a diagram showing wave-forms at various portions in FIG. 11. The kick back signal having a wave-form "a" which is applied to the contact A1 appears as having a wave-form "b1" at the node P1 and appears as having a wave-form "c" at node Q. If the voltage level at the node 2 is assumed as substantially equal to the voltage level at node Q (actually it can be expected that the voltage level at the node P2 is not higher than that at the node Q), the peak value due to the kick back is represented by the following formula (1).

$$\text{kick back amplitude} = 2 \times \Delta Va \times r1/(r1+r2) \quad (1)$$

In order to suppress the kick back amplitude at the node P2 not higher than k-times of that in the prior art, it is necessary to meet the following formula (2)

$$2 \times \Delta Va \times r1/(r1+r2) \leq k \times \Delta Va \quad (2)$$

The formula (2) can be modified into formula (3) so that r2 is located on the left side of the formula.

$$r2 \geq (2/k-1) \times r1 \quad (3)$$

The influence of the kick back can be reduced to a half or less if r2 is made 600Ω or more in case of k=0.5, r1=200Ω.

Embodiment 3

Figure 4:
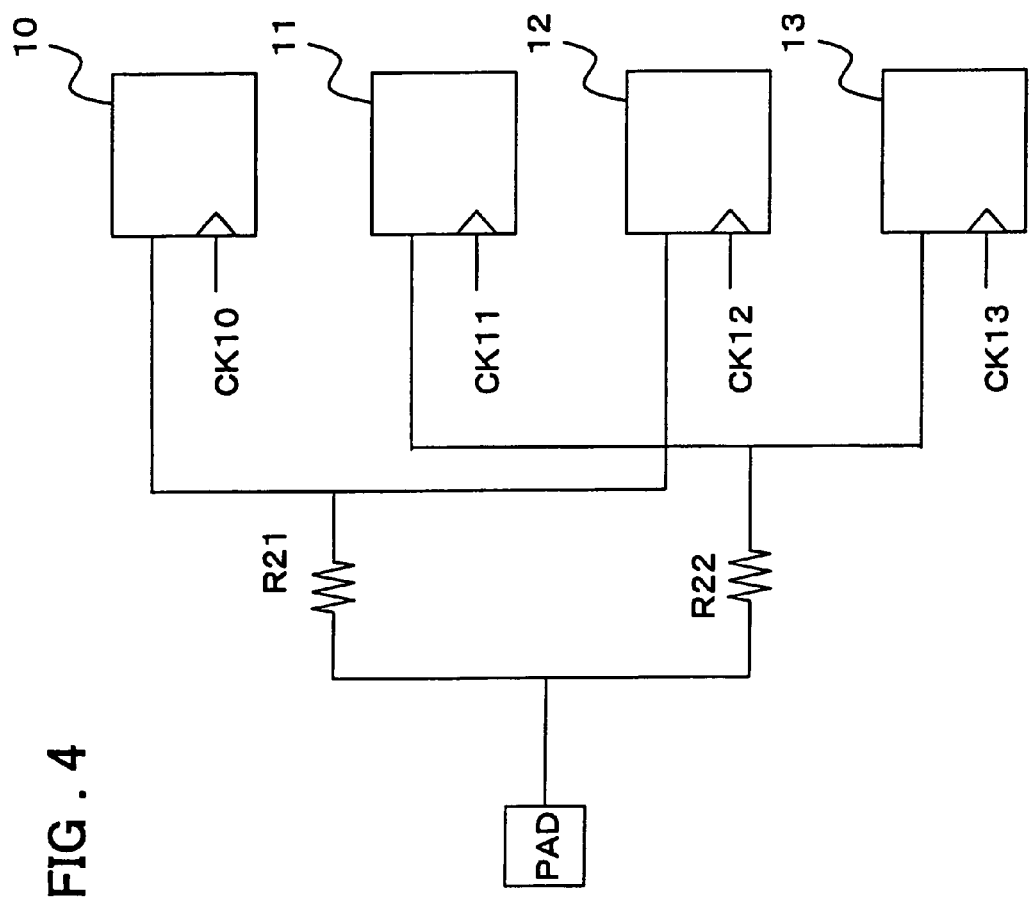
FIG. 4 is a block diagram showing the configuration of a semiconductor device of a third embodiment of the present invention.

FIG. 4 is a block diagram showing the configuration of a semiconductor device of a third embodiment of the present invention. As shown in FIG. 4, the semiconductor device comprises a pad PAD, resistor elements R21, R22 and input circuits 10, 11, 12 and 13. The input circuits 10, 12 have a common input end which is connected to the pad PAD via the resistor element R21. The input circuits have a common input end which is connected to the pad PAD via the resistor element R22. Since the input circuits 10, 11, 12 and 13 are similar to those of embodiment 1 and similarly function, the description thereof will be omitted.

In the semiconductor device of FIG. 4, the resistor element R21 is commonly used in lieu of the resistor elements R1, R3 in FIG. 1 and the resistor element R22 is commonly used in lieu of the resistor elements R2, R4. Accordingly, the number of the resistor elements can be reduced to a half of that in the semiconductor device of FIG. 1. The kick back at the input circuit 10 will reach the input end of the input circuits 11, 13 via the resistor elements R21, R22. Similarly to the embodiment 1, the signal component caused by the kick back is attenuated by the resistor elements and reaches the other input circuit. Thus, the influence of the kick back at one input circuit upon the other input circuit is very small. The kick back of the input circuit will directly reach the input end of the input circuit 12. However, since the time interval (phase) between the edges of the clock signals CK10, CK12 which are input to the input circuits to which data are directly connected is double of that between the edges of clock signals CK10, CK11, the influence of the kick back is very small so that the problem is not serious. The same applies for the other input circuits.

Embodiment 4

Figure 5:
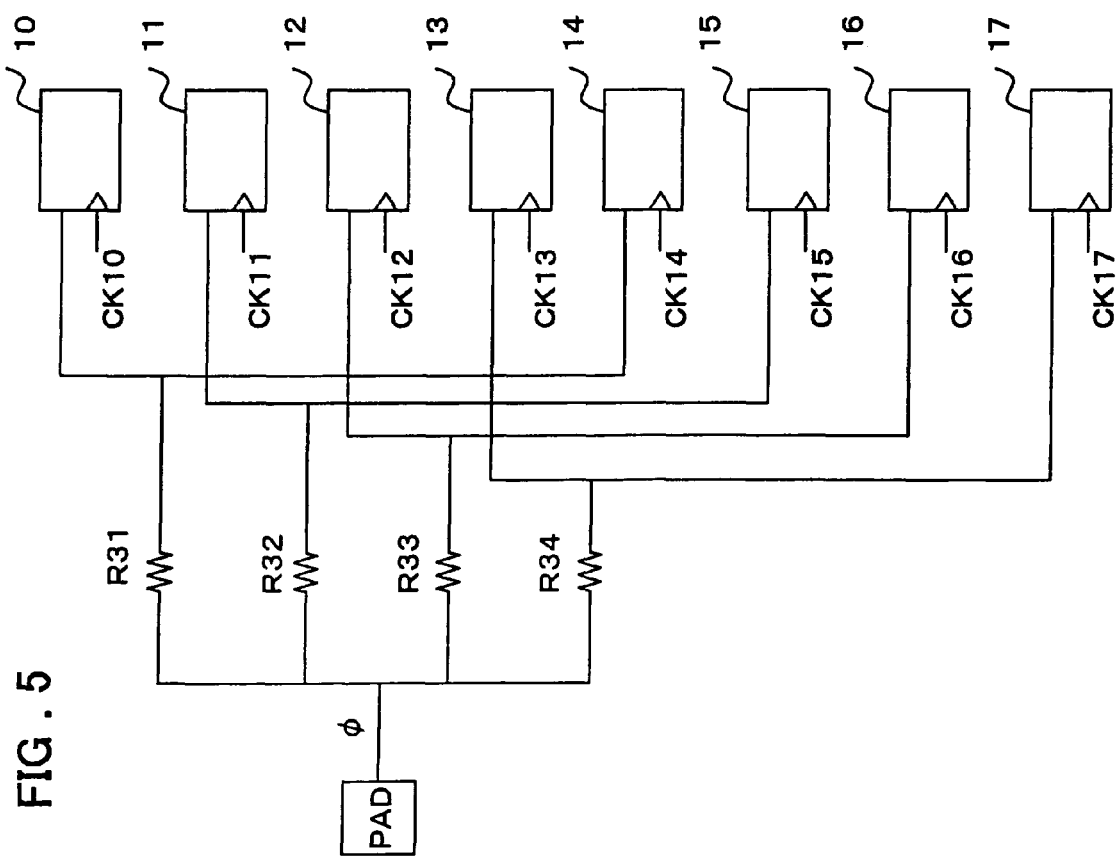
FIG. 5 is a block diagram showing the configuration of a semiconductor device of a fourth embodiment of the present invention.

FIG. 5 is a block diagram showing the configuration of the semiconductor device of a fourth embodiment of the present invention. The semiconductor device comprises a pad PAD which is an external input terminal resistor elements R31, R32, R33, R34 and input circuits 10 through 17. The semiconductor device of FIG. 5 is an extension of that in FIG. 1 in which 8 input circuits are connected to one external input terminal. Each of the input circuits 10 through 17 comprises, for example, an input circuit 100 which has been described with reference to FIG. 7. The input circuits 10 and 14; 11 and 15; 12 and 16; 13 and 17 are connected to the pad PAD through the resistor elements R31, 32, 33, 34, respectively. Clock signals CK10 through CK17 are input to the input circuits 10 through 17, respectively to accept input data φ supplied to the pad PAD. The input circuits 10 through 17 are activated in response to the level transition of the clock signals CK10 through CK17 supplied thereto for amplifying the signals applied to the pad PAD. The clock signals are out-of-phase by ⅛ of period from one another. The input circuits 10 through 17 accept in put data having respective time lags.

The above-mentioned semiconductor device comprises four resistor elements R31, R32, R33 and R34 which are shared by the input circuits (pair) 10 and 14, 11 and 15, 12 and 16, 13 and 17, respectively, between which the interval of the clock for activating the input circuits is longest. Such an arrangement makes it possible to make the interval between the edges of the clock for the input circuit having a common input terminal four times of that in case in which one resistor elements are commonly used by 8 input circuits. Influence of the kick back can be suppressed even if higher response for data is needed.

In accordance with the present invention, it is possible to extend the above-mentioned semiconductor device so that it comprises N resistor elements, each being commonly connected to the input ends of M input circuits. A first to N-th resistor elements have one end which is connected to an external input terminal PAD. In first through N×M input circuits, K-th (K is a natural number of 1 through N), (K+N)-th, . . . , K+N(M−1)-th input circuits have a common input end which is connected to the other end of the K-th resistor element and are activated in response to the level transition of clock signals supplied thereto for accepting input signals applied to the external input terminal. If the period of the clock signal is represented by T, the clock signals which are out-of-phase by L×T/(M×N) input circuit. In such an arrangement, the clock signals which are applied to the K-th, (K+N)-th, . . . , (K+N(M−1))-th input circuits are out-of-phase by T/M, so that phase shift can be made N times of the interval between the clock edges in case where one resistor element is shared by all input circuit.

Figure 6:
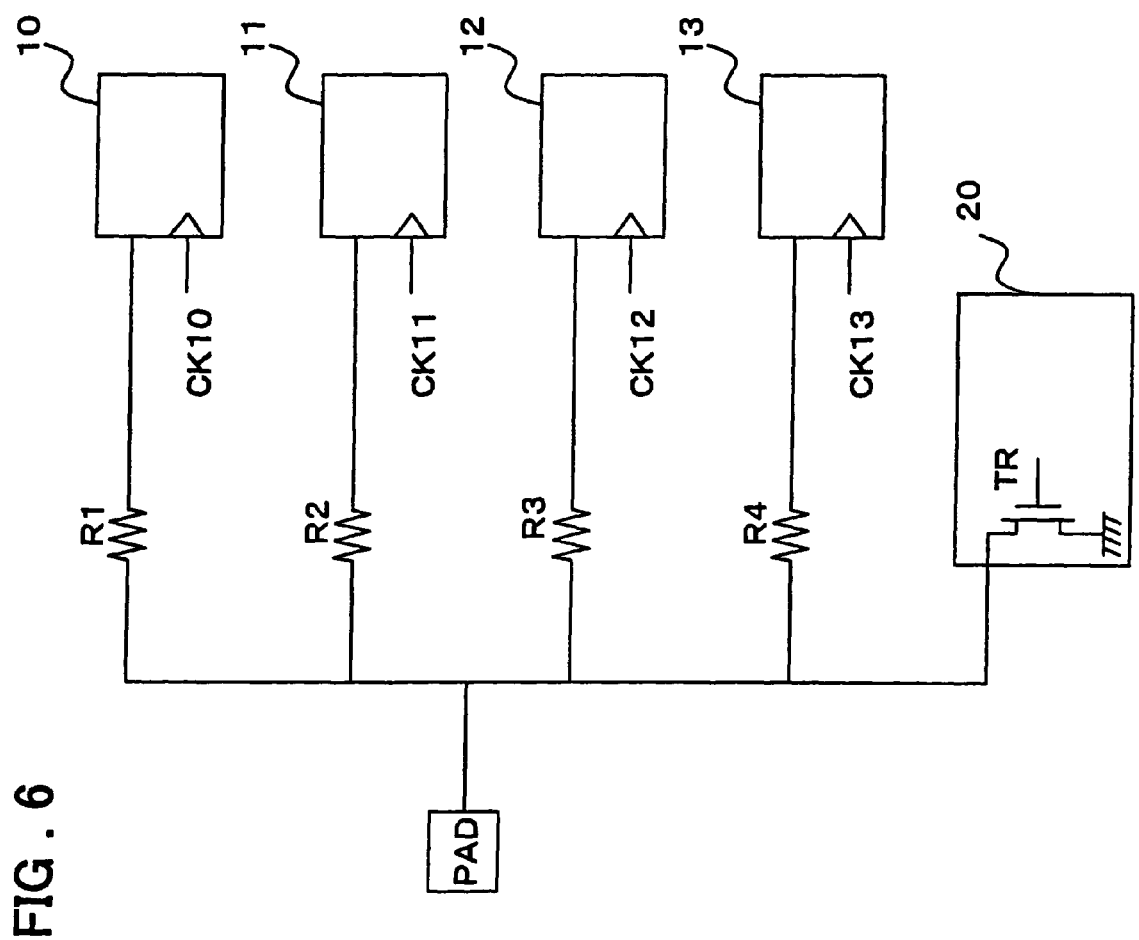
FIG. 6 is a block diagram showing the configuration of a semiconductor device of a fifth embodiment of the present invention.

FIG. 6 is a block diagram showing the configuration of the semiconductor of a fifth embodiment of the present invention. In FIG. 6, the semiconductor device comprises a pad PAD which is an external input terminal; resistor elements R1, R2, R3, R4; input circuits 10, 11, 12, 13; and an output circuit 20. The semiconductor device of the fifth embodiment is substantially identical with that of the first embodiment except that the output circuit 20 is added in the former. Since the pad PAD, the resistor elements R1, R2, R3, R4 and input circuits 10, 11, 12, 13 are identical with those in FIG. 1, description thereof will be omitted. The output circuit 20 comprises a transistor TR, which is turned on or off to send an output signal to the pad PAD. The transistor TR serves as an output transistor when the semiconductor device is operated and serves as a discharge protective element like the transistor Q100 shown in FIG. 7 when the power supply is turned off. In such a manner, the semiconductor device of FIG. 6 enables the pad PAD and the transistor TR of the output circuit to serve as an I/O terminal and input protective element, respectively. It is needless to say that the output circuit 20 is also applicable to embodiments 2, 3, 4 as well as embodiment 1.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a terminal to which an input signal is supplied externally to the device in an input mode and from which an output signal is produced externally from the device in an output mode;
a first input circuit having a first input node and activated in the input mode to respond to the input signal;
a second input circuit having a second input node and activated in the input mode to respond to the input signal when the first input circuit is deactivated;
a first resistor element connected between the terminal and the first input node of the first input circuit;
a second resistor element connected between the terminal and the second input node of the second input circuit;
a power line;
a reference potential line; and
an output circuit connected to the terminal and activated in the output mode to drive the terminal to produce the output signal, the output circuit comprising an output transistor that includes a source-drain path connected between the terminal and the reference potential line, the output transistor further including a gate that is free from a continuous connection to each of the power line and the reference potential line so that the output transistor is turned ON and OFF to send the output signal to the terminal.

2. The device as claimed in claim 1, wherein the transistor functions as an electrostatic discharge circuit for the first and second input circuits.

3. The device as claimed in claim 1, wherein the first input circuit is activated in response to a first clock signal to respond to the input signal and the second input circuit is activated in response to a second clock signal to respond to the input signal, the first clock signal being different in phase from the second clock signal.

4. The device as claim in claim 3, wherein the transistor function as an electrostatic discharge circuit for the first and second input circuits.

5. The device as claimed in claim 1, further comprising a third resistor element, the first resistor element being connected in series with the third resistor element between the terminal and the first input node of the first input circuit without an intervention of the second resistor element, and the second resistor element being connected in series with the third resistor element between the terminal and the second input node of the second input circuit without an intervention of the first resistor element.

6. The device as claimed in claim 5, wherein the first and second input circuits are activated in response respectively to first and second clock signals, the first and second clock signals being different in phase from one another.

7. The device as claimed in claim 1, further comprising a third input circuit having a third input node connected to the terminal through the first resistor element, the third input circuit being activated in the input mode to respond to the input signal when each of the first and second circuits is deactivated.

8. The device as claimed in claim 7, wherein the output circuit includes a transistor having a source-drain path connected between the terminal and a reference voltage line to function as an electrostatic discharge circuit for the first, second and third circuits.

9. The device as claimed in claim 7, wherein the first, second and third input circuits are activated in response respectively to first, second and third clock signals, the first, second and third clock signals being different in phase from one another.

10. The device as claimed in claim 7, further comprising a fourth input circuit having a fourth input node connected to the terminal through the second resistor element, the fourth circuit being activated in the input mode to respond to the input signal when each of the first, second and third circuits is deactivated.

11. The device as claimed in claim 10, wherein the output circuit includes a transistor having a source-drain path connected between the terminal and a reference voltage line to function as an electrostatic discharge circuit for the first, second, third and fourth circuits.

12. The device as claimed in claim 10, wherein the first, second, third and fourth input circuits are activated in response respectively to first, second, third and fourth clock signals, the first, second, third and fourth clock signals being different in phase from one another.

13. A semiconductor device, comprising:
a terminal to which an input signal is supplied externally to the device in an input mode, and from which an output signal is produced externally from the device in an output mode;
a first input circuit having a first input node and activated m the input mode to respond to the input signal;
a second input circuit having a second input node and activated in the input mode to respond the input signal when the first input circuit is deactivated;
a first resistor element connected between the terminal and the first input node of the first input circuit;
a second resistor element connected between the terminal and the second input node of the second input circuit; and
an output circuit connected to the terminal and activated in the output mode to drive the terminal to produce the output signal;
wherein the first input circuit is activated in response to a first clock signal to respond to the input signal and the second input circuit is activated in response to a second clock signal to respond to the input signal, the first clock signal being different in phase from the second clock signal;
wherein the output circuit includes a transistor having a source-drain path connected between the terminal and a reference voltage line to function as an electrostatic discharge circuit for the first and second input circuits; and
wherein each of the first and second input circuits includes a differential circuit, a current source connected to the differential circuit and activated in response to an active level of an associated one of the first and second clock signals, a latch circuit connected to the differential circuit to latch an output from the differential circuit and a reset circuit connected to the latch circuit to reset an output of the latch circuit in response to an inactive level of the associated one of the first and second clock signals.

* * * * *